United States Patent
Engelmann et al.

(10) Patent No.: US 9,214,355 B2
(45) Date of Patent: Dec. 15, 2015

(54) MOLECULAR RADICAL ETCH CHEMISTRY FOR INCREASED THROUGHPUT IN PULSED PLASMA APPLICATIONS

(71) Applicants: International Business Machines Corporation, Armonk, NY (US); Zeon Corporation, Tokyo (JP)

(72) Inventors: Sebastian U. Engelmann, White Plains, NY (US); Nathan P. Marchack, White Plains, NY (US); Masahiro Nakamura, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/520,432

(22) Filed: Oct. 22, 2014

(65) Prior Publication Data
US 2015/0118854 A1  Apr. 30, 2015

Related U.S. Application Data

(60) Provisional application No. 61/895,460, filed on Oct. 25, 2013.

(51) Int. Cl.
 *H01L 21/302* (2006.01)
 *H01L 21/3065* (2006.01)
 *H01L 21/311* (2006.01)
 *H01L 21/3213* (2006.01)

(52) U.S. Cl.
 CPC ...... *H01L 21/3065* (2013.01); *H01L 21/31116* (2013.01); *H01L 21/31138* (2013.01); *H01L 21/32137* (2013.01)

(58) Field of Classification Search
 CPC .................................................. H01L 21/3065
 USPC ...................................... 438/745; 216/37, 67
 See application file for complete search history.

(56) References Cited

U.S. PATENT DOCUMENTS

2008/0081483 A1\* 4/2008 Wu .............................. 438/714

OTHER PUBLICATIONS

Banna et al., "Pulsed high-density plasmas for advanced dry etching processes", JVSTA Journal of Vacuum Science & Technology A, vol. 30, Issue 4, (2012), © 2012 American Vacuum Society.
Engelmann et al., U.S. Appl. No. 61/895,460, filed Oct. 25, 2013.
Petit-Etienne et al., "Silicon recess minimization during gate patterning using synchronous plasma pulsing", JVSTB Journal of Vacuum Science & Technology B, vol. 30, Issue 4, (2012), © 2012 American Vacuum Society.

\* cited by examiner

*Primary Examiner* — Duy Deo
*Assistant Examiner* — Maki Angadi
(74) *Attorney, Agent, or Firm* — Fusheng Xu

(57) ABSTRACT

As device feature size shrinks, plasma induced damage is a major concern affecting micro-electronic and nano-electronic device fabrication. Pulsed plasmas are a means of mitigating the damages. However, in conventional standard etch chemistry, the etch rate for pulsed plasmas is reduced significantly resulting in a substantially decreased throughput of tech processes. A new etch chemistry is disclosed in the present invention to increase throughput in pulsed plasma applications driven mainly by the molecular radicals.

14 Claims, 6 Drawing Sheets

MOLECULAR RADICAL ETCH CHEMISTRY FOR INCREASED THROUGHPUT IN PULSED PLASMA APPLICATIONS

FIELD OF THE INVENTION

The present invention relates generally to the field of semiconductor manufacturing, and more particularly to plasma etching process.

BACKGROUND OF THE INVENTION

Plasma etching has been an indispensable tool in the semiconductor manufacturing industry to precisely transfer mask patterns to underlying layers of solid material. As down scaling of device feature size continues, the challenges faced in many plasma etching processes become exacerbated, including: (i) higher selectivity; (ii) more anisotropic etch (i.e., vertical etch rate must greatly exceed the lateral etch rate due to high-aspect ratio demands); (iii) tighter critical dimension control; (iv) reduced plasma induced damage; and (v) superior throughput. High density plasmas (HDPs), such as electron cyclotron resonance (ECR) plasmas, helicon wave plasmas, and inductively coupled plasmas (ICPs), have been widely used in etching processes to meet some of the previously listed challenges.

However, such HDPs, for example, ICP reactors using a radio frequency (RF) power, source are operated in a continuous wave (CW) RF mode where plasma is excited with constant average power or voltage in a vacuum chamber, which results in potential plasma induced damage (PID) posing a risk to device performance. PID can occur in one or more of the following forms: (i) surface physical damage from highly energetic ions bombarding the wafer; (ii) photon bombardment from high ultraviolet (UV); (iii) photon bombardment from vacuum ultraviolet (VUV) radiation; (iv) plasma non-uniformity induced charging arising from spatial non-uniformity; and (v) differential charging due to negative charging at the top of the high aspect ratio features and positive charging at the bottom.

PID is a major concern affecting micro-electronic and nano-electronic device fabrication. The effects of damage from ion bombardment, UV radiation exposure, and surface charging become more pronounced as the size of devices continues to be scaled down. Time-modulated or pulsed plasmas have been investigated as a means of minimizing the aforementioned damage. Two main parameters characterize the pulse (e.g., an RF pulse): (i) pulse frequency at which the RF power is turned on and off per second; and (ii) pulse duty cycle (DC) defined as the percentage of time which the RF power is on during a single pulse. Pulsed plasmas provide additional "tunable knobs" through which primary plasma properties can be controlled. For example, in an RF pulsed plasma, the supply of RF power to the source and/or bias is switched on and off at set frequency. Additionally, the duty cycle can be varied in a pulsed plasma. Pulsed plasmas, in general, exhibit lower electron temperature, ion energies, plasma densities, and UV radiation than a conventional CW plasma discharge, all of which contribute to reduced damage.

SUMMARY

According to an aspect of the present invention, there is a process for increased etch throughput in pulsed plasmas that comprises the following steps: (i) introducing a first gas having a general chemical formula of $C_xH_yF_z$ into a pulsed plasma; (ii) creating an etch chemistry in the pulsed plasma, the etch chemistry including: (1) the first gas, $C_xH_yF_z$, (2) molecular radicals generated by dissociation of the first gas in the pulsed plasma that dominate the first etch chemistry, (3) atomic radicals generated by dissociation of the first gas in the pulsed plasma, (4) ions generated from the first gas in the pulsed plasma, and (5) electrons generated from the first gas in the pulsed plasma; and (iii) performing etching on a material to be etched, wherein the first general chemical formula is further defined by x being greater than 3 and y being greater than z.

DETAILED DESCRIPTION

A drawback of using pulsed plasmas is the reduction in etch rate that is observed, due to the fact that the bias (and/or source) power is only on for a portion of the pulse time. This is especially apparent at lower values of duty cycle. This has substantial implications for the throughput of an etching process as the effective time needed to etch a given material layer or structure increases dramatically.

Some embodiments of the present invention disclose an etching chemistry and use of the same for increased throughput in pulsed plasma etching applications. The chemistry is primarily driven by molecular radicals. Consequently a pulsed plasma solution which does not result in appreciable loss of etch rate as duty cycle decreases is obtained. In this way, potentially damaging exposure to ion bombardment and UV radiation is reduced while minimizing increases in the process time for etching.

Reference will now be made in detail to the embodiments of the present invention, examples of which are illustrated in the accompanying figures. Wherever possible, the same reference numbers will be used throughout the figures to refer to the same or like parts.

Figure 1A:
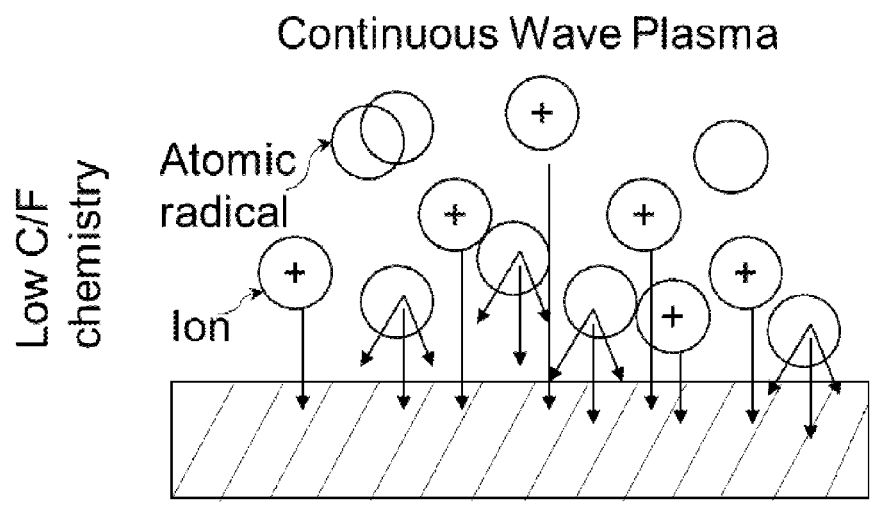
FIGS. 1A, 1B, 1C, and 1D are diagrams depicting the conventional etch chemistry and the disclosed etch chemistry in continuous wave plasma and pulsed plasma according to an embodiment of the present invention.
Figure 1B:
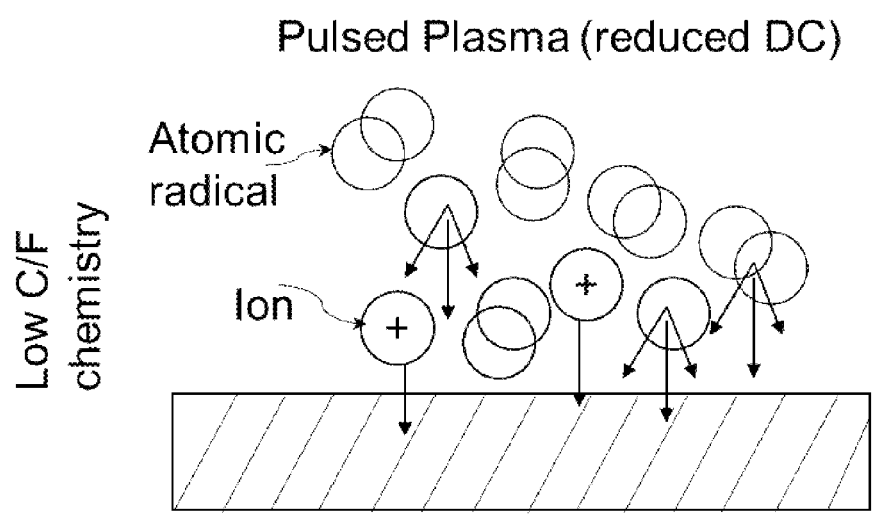

In a typical pulsed plasma, as the duty cycle is decreased the density of atomic radicals decreases and the density of molecular radicals increases. Additionally, the ion and electron fluxes are varied more significantly than the radical flux due to the short time scale (e.g., ~10 microseconds) involved in the decay times of charged species. In traditional fluorocarbon based chemistries, for example, low C/F ratio chemistry $CF_x/CH_xF_y$, where x and y are numbers ranging from 1-4 with the sum of these numbers being 4 when they appear in the same molecule (i.e. in $CH_xF_y$, if x=1 then y=4−x=3), the etch is primarily driven by ions and atomic radicals and thus decreasing the duty cycle reduces the etch rate significantly, as shown in FIGS. 1A and 1B.

Figure 1C:
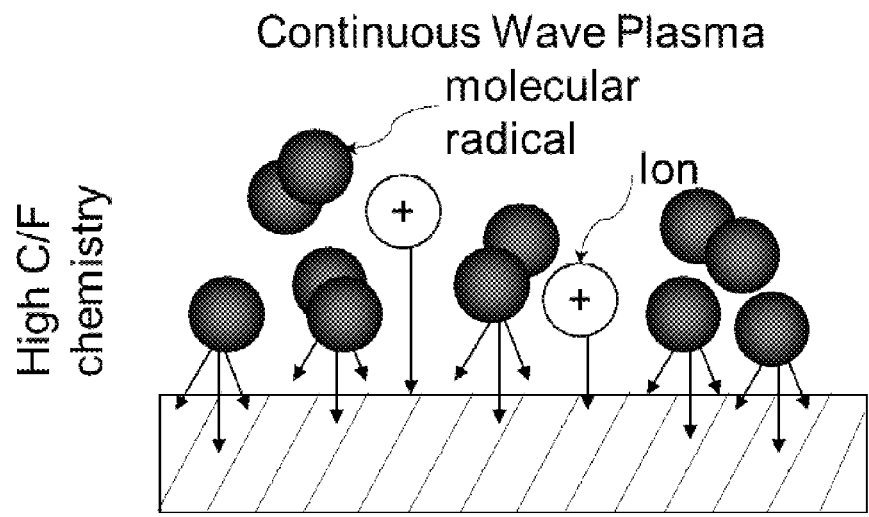
Figure 1D:
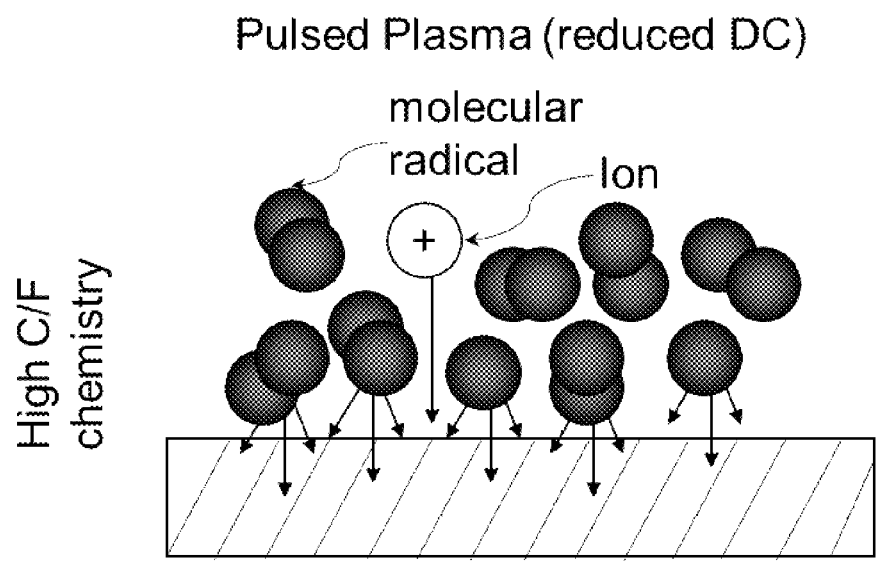

The general formulation for a gas chemistry according to the present invention is $C_xH_yF_z$ (where x>3 and y>z), herein also referred to as high C/F ratio chemistry (e.g., with sufficient oxygen addition). One example of such high C/F ratio chemistry is $C_4H_9F$. Such gases behave differently under plasma conditions (both CW mode and pulsed mode) than conventional $CF_x/CH_xF_y$ chemistries as the dissociation is overall much lower and, thus, the etch and polymerization process is generally driven by molecular radicals, not ions. Thus the effect of reducing the ion and atomic radical concentrations is not as pronounced in the high C/F ratio chemistry, and a significant drop in etch rate is not seen, as depicted in FIGS. 1C and 1D.

Figure 2A:
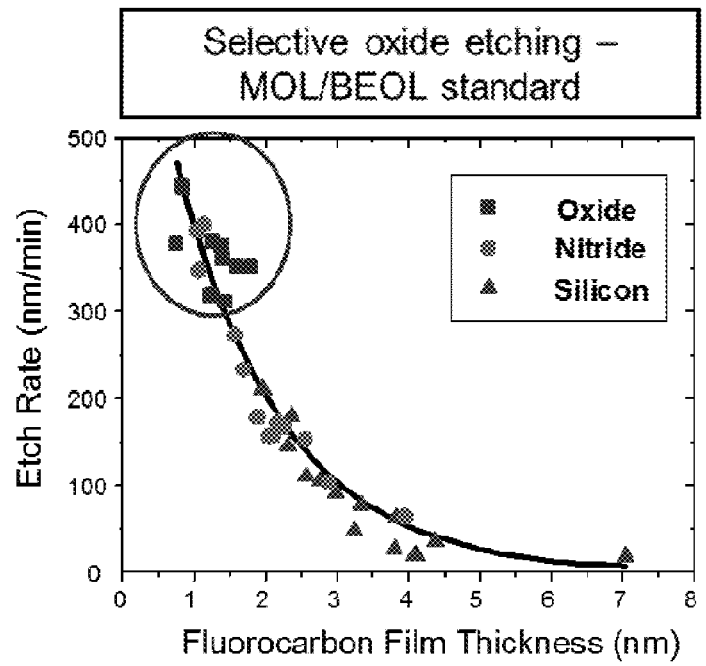
FIGS. 2A and 2B are diagrams comparing etch selectivity of the disclosed etch chemistry and the conventional etch chemistry for spacer chemistries in a radio-frequency (RF) pulsed inductively coupled plasma (ICP), in accordance with an embodiment of the present invention.
Figure 2B:
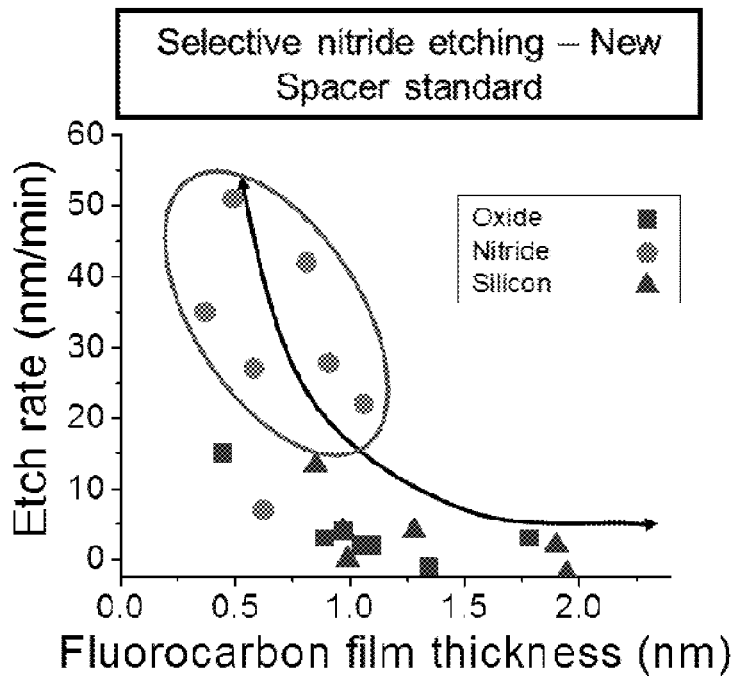

Referring now to FIGS. 2A and 2B, illustrated are diagrams comparing etch selectivity of the novel gas chemistry and the conventional $CF_x/CH_xF_y$ chemistry for spacer chemistries in an RF pulsed inductively coupled plasma (ICP), in accordance with an embodiment of the present invention. In this exemplary embodiment, a unique property of the disclosed gas is exhibited: the inversion of selectivity with regards to silicon oxide and silicon nitride etching. Traditionally $CF_4/CHF_3$ chemistries are used to etch dielectric materials, usually selectively etching oxide, that is, the conventional $CF_x/CH_xF_y$ chemistry achieves higher oxide etch rates, as shown in FIG. 2A where MOL refers to middle of line and BEOL refers to back end of line. However, the high C/F ratio chemistry, $C_xH_yF_z$ (where x>3 and y>z), possesses different polymerization mechanism than $CF_4/CHF_3$ such that it selectively etches nitride, that is, such gas etches silicon nitride with excellent selectivity to silicon oxide and poly-Si, as illustrated in FIG. 2B where nitride data shows thinnest fluorocarbon (FC) films with highest etch rate (ER). Alternatively, the same basic trend or similar experimental data can be obtained in a capacitively coupled pulsed plasma (CPP).

In some embodiments, high selectivity to organic planarization layer (OPL) materials (also referred to as soft mask) is obtained by applying the novel gas chemistry $C_xH_yF_z$ (where x>3 and y>z) compared to a $CH_3F/O_2$ admixture. OPL is typically the layer closest to a target substrate in a tri-layer approach for patterning, and as such has a variety of demands placed on it, including: (i) low defectivity; (ii) low outgassing; and (iii) minimal line bending within the final plasma etch step. The novel gas exhibits excellent selectivity to soft mark materials and provides a vastly expanded process window for other applications, for example, hard mask open (HMO) patterning where a higher nitride etch rate can be achieved while maintaining the selectivity to OPL for a large range of process conditions by applying the novel gas chemistry in a pulsed plasma compared to the conventional $CF_x/CH_xF_y$ chemistry.

Figure 3A:
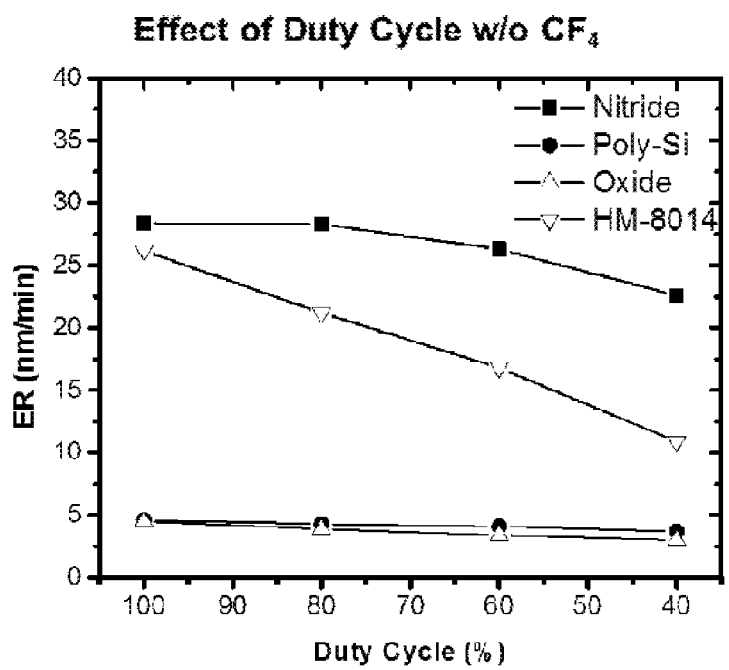
FIGS. 3A and 3B are diagrams comparing the blanket etch rates of materials in the disclosed etch chemistry and the conventional etch chemistry for both bias and synchronous pulsing, in accordance with an embodiment of the present invention.
Figure 3B:
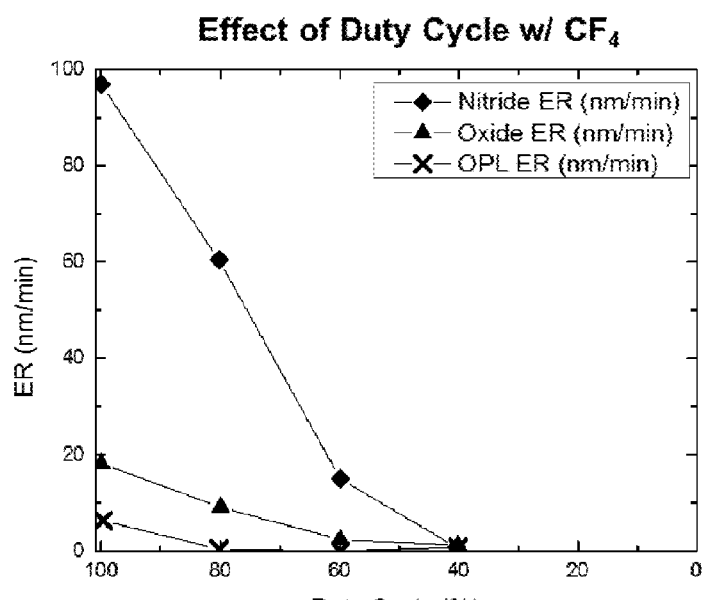

Referring now to FIGS. 3A and 3B, illustrated are diagrams comparing the blanket etch rates of materials in the novel gas chemistry and the conventional $CF_x/CH_xF_y$ chemistry for both bias pulsing and synchronous pulsing, in accordance with an embodiment of the present invention. In this exemplary embodiment, the applied gas is $C_4H_9F$, according to the present invention, and the conventional $CF_x/CH_xF_y$ chemistry is $CF_4$. The term "bias pulsing" refers to the pulsing of the bias generator, and the term "synchronous pulsing" refers to the simultaneous pulsing of both the bias source and the power source with or without time delay between them. Minimal penalty is obtained in the etch rate of SiN, poly-Si, oxide, and OPL with reducing duty cycle down to 40%, while improved selectivity to OPL is continued to be achieved, as shown in FIG. 3A where the experimental recipe includes: (i) vacuum at 70 mT; (ii) power supplied by the plasma source generator at 350 watts; (iii) power supplied by the plasma bias generator at 70 watts; and (iv) $16C_4H_9F/25O_2/200He$. The $C_4H_9F$ admixtures show insignificant drop in etch rate for a wide range of pulsed plasma conditions. Alternatively, etch rate tuning can be achieved through addition of $CF_4$ chemistry to the $C_4H_9F$ chemistry.

FIG. 3B depicts the etch rate for nitride, oxide, and OPL in a $C_4H_9F$ plus $CF_4$ chemistry for a pulsed plasma application where the experimental recipe includes: (i) vacuum at 30 mT; (ii) power supplied by the plasma source generator at 500 watts; (iii) power supplied by the plasma bias generator at 100 watts; and (iv) $12C_4H_9F/15O_2/20CF_4$. As seen in FIG. 3B, addition of $CF_4$ to the $C_4H_9F$ results in significant reduction in the etch rates of nitride, oxide, and OPL with respect to the decrease of duty cycle, which is a typical "conventional" behavior that is observed with reduction in duty cycle for pulsed plasmas, that is, reduced throughput due to a lower etch rate when using pulsed plasma generation. In this example, the gas concentrations ranges from about $3O_2$:$2C_4H_9F$ to about $2O_2$:$2C_4H_9F$:$3CF_4$, the duty cycle ranges from about 40% to about 100%, and the frequency of pulsing ranges from about 1 KHz to about 2 KHz.

Figure 4:
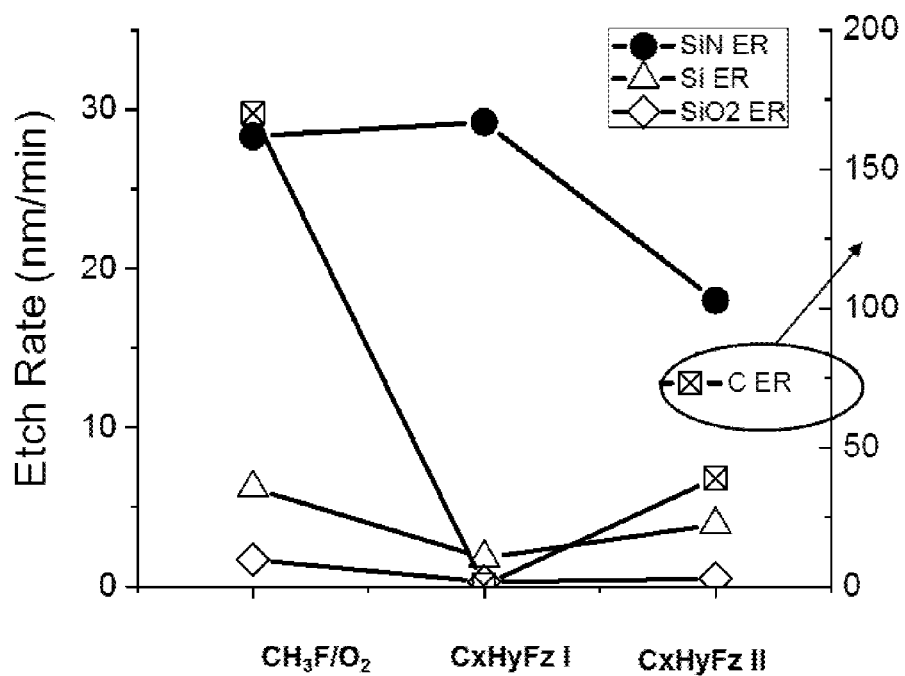
FIG. 4 shows higher nitride etch rate with lower erosion rates of Si and oxide by applying the disclosed etch chemistry, in accordance with an embodiment of the present invention.

In yet another embodiment, as depicted in FIG. 4, higher nitride etch rate with lower erosion rates of Si and oxide is demonstrated by applying the high C/F ratio chemistry. Also shown in this embodiment is that selectivity to C-based materials in the high C/F ratio chemistry expands process capabilities greatly (see FIG. 4). The etch rates of Si and $SiO_2$ are based on removal after plasma exposure, and $O_2$ strip plus diluted hydro-fluoric acid (DHF) process.

Figure 5:
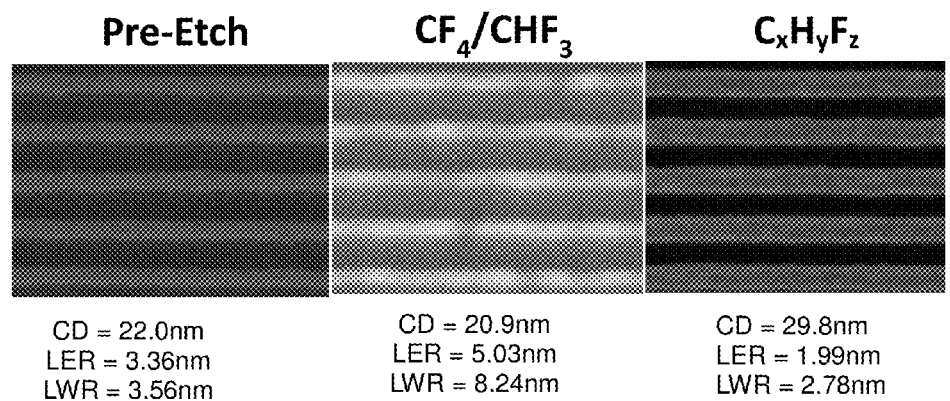
FIG. 5 demonstrates high fidelity patterning at about 50 nm pitch test macros for patterning applications by applying the disclosed etch chemistry, in accordance with an embodiment of the present invention.
Figure 6:
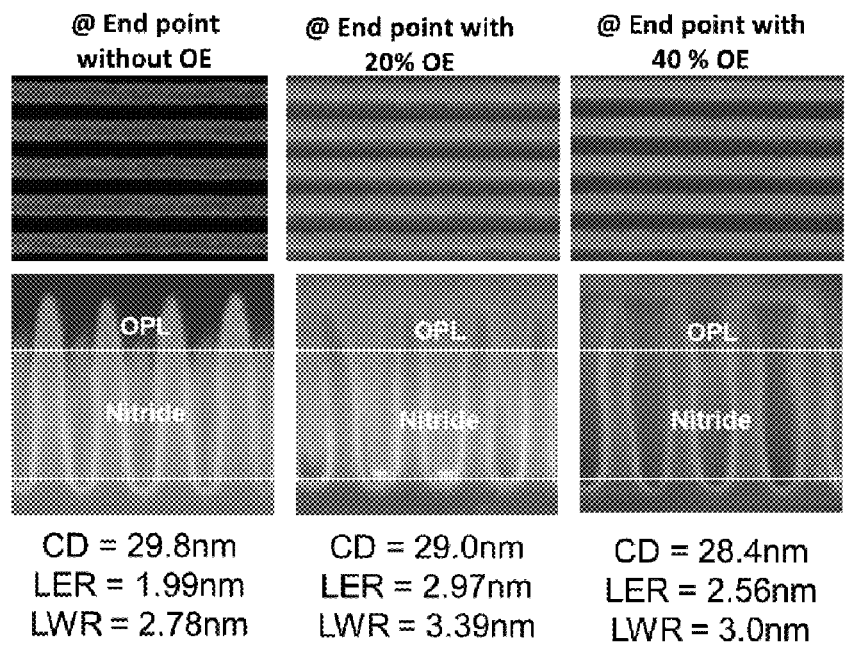
FIG. 6 depicts the improved over-etch performance achieved using the disclosed etch chemistry, in accordance with an embodiment of the present invention.

Referring now to FIGS. 5 and 6 for some embodiments for patterning applications, high fidelity patterning at about 50 nm pitch test macros is achieved using the high C/F ratio gas chemistry. Conventionally, a tri-layer approach is used in patterning, which consists of layers with alternating etch selectivity for fluorocarbon and oxygen containing chemistries. Organic planarizing layer (OPL) is typically the layer closest to the target substrate. The requirement of minimal line bending within the final plasma etch step for OPL is highly critical as it relates to the generation of line edge roughness (LER) and line width roughness (LWR) and the maintenance of pattern fidelity. As down scaling continues, OPL loss, deformation, profile taper, and LER/LWR are all significant issues that must be addressed. In this exemplary embodiment, as shown in FIG. 5, the minimal critical dimension (CD) gain is observed compared to the conventional gas chemistry $CF_4/CHF_3$, and the LER/LWR is significantly lower by employing the high C/F ratio gas chemistry (i.e., LER=1.99 nm and LWR=2.78 nm in the high C/F ratio gas chemistry; LER=5.03 nm and LWR=8.24 nm in the conventional gas chemistry). As such, high fidelity patterning is achieved with reduced LER and LWR. Further, the high C/F ratio gas chemistry results in improvement in selectivity compared to the conventional gas chemistry. Consequently, the high selectivity to OPL of this high C/F ratio chemistry allows for excellence over-etch (OE), as described in FIG. 6. FIG. 6 depicts three images of a pattern with 0% OE, 20% OE, and 40% OE, respectively. As shown in FIG. 6, very little OE into substrate and very little erosion of OPL are demonstrated. Even at OE up to 40% of the main etch (ME) time, the LER/LWR does not approach the levels found in the conventional processes, which provides a large process window. Further, by providing higher selectivity the high C/F ratio gas chemistry can facilitate scaling below the 40 nm node.

Some embodiments of the present invention may include one, or more, of the following features, characteristics and/or advantages: (i) the roughening behavior of a high C/F ratio gas is superior to conventional $CF_4/CHF_3$ gas, with excellent at-pitch profiles and over-etch capabilities; (ii) a high C/F ratio gas chemistry exhibits a high selectivity to OPL (soft mask) material; (iii) plasma induced damages (PIDs) are reduced using time-modulated (pulsing) plasmas; (iv) the pulsed plasmas include plasmas using RF or microwave power sources; (v) the RF-powered pulsed ICPs include source pulsing, bias pulsing, and synchronous pulsing with or without time delay between the bias and source; (vi) a high C/F ratio gas chemistry shows minimal penalty of etch rate on duty cycle in pulsed plasmas; (vii) the etch rate in a high C/F ratio gas chemistry is tunable by adding the conventional $CF_x/CH_xF_y$ chemistry to the high C/F ratio gas; (viii) a high C/F ratio gas shows the inversion of selectivity with regards to oxide and nitride etching; and/or (iv) a high C/F ratio chemistry provides a large process window for pulsing plasmas.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A process for increasing etch throughput in pulsed plasmas, comprising:
   introducing a first gas having a first general chemical formula of $C_xH_yF_z$ into a pulsed plasma;
   creating an etch chemistry in the pulsed plasma, the etch chemistry including: (i) the first gas, $C_xH_yF_z$, (ii) molecular radicals generated by dissociation of the first gas in the pulsed plasma that dominate the etch chemistry, (iii) atomic radicals generated by dissociation of the first gas in the pulsed plasma, (iv) ions generated from the first gas in the pulsed plasma, and (v) electrons generated from the first gas in the pulsed plasma; and
   performing etching on a material to be etched:
   wherein the first general chemical formula is further defined by x being greater than 3 and y being greater than z.

2. The process of claim 1, further comprising:
   introducing a second gas having at least one of a second general chemistry formula $CF_x$ and $CH_xF_y$, into the pulsed plasma;
   wherein the second general chemical formula is further defined by x being a first number ranging from 1-4, y being a second number ranging from 1-4, and the sum of x and y is 4 when x and y appear in a same molecule.

3. The process of claim 2, wherein the etch chemistry further includes:
   the second gas;
   molecular radicals generated by dissociation of the second gas in the pulsed plasma;
   atomic radicals generated by dissociation of the second gas in the pulsed plasma;
   ions generated from the second gas in the pulsed plasma; and
   electrons generated from the second gas in the pulsed plasma.

4. The process of claim 1, further comprising:
   introducing a third gas, $O_2$, into the pulsed plasma.

5. The process of claim 4, wherein the third gas concentration with respect to the first gas is $3O_2:2C_xH_yF_z$.

6. The process of claim 4, wherein the second and third gas concentrations with respect to the first gas is $2O_2:2C_xH_yF_z: 3CF_x$ and/or $CH_xF_y$.

7. The process of claim 1, wherein the pulsed plasma is one of the following plasmas: (i) an electron cyclotron resonance (ECR) plasma; (ii) a helicon wave plasma; (iii) a radio-frequency (RF) inductively coupled plasma (ICP); and (iv) a capacitively coupled plasma (CCP).

8. The process of claim 7, wherein the radio-frequency inductively coupled plasma is one of a pulsing that follows: (i) a source pulsing; (ii) a bias pulsing; and (iii) a synchronous pulsing, the pulsing being with or without a time delay between the bias pulsing and the source pulsing.

9. The process of claim 1, wherein the pulsed plasma has a duty cycle ranging from 40% to 100%.

10. The process of claim 1, wherein the pulsed plasma has a pulsing frequency ranging from 1 KHz to 2 KHz.

11. The process of claim 1, wherein the material to be etched includes at least one of: silicon nitride, silicon oxide, organic polymerization layer, and poly-Si.

12. The process of claim 1, wherein the etch chemistry has a high selectivity to an organic polymerization layer (OPL) material.

13. The process of claim 1, wherein the etch chemistry has a minimal penalty of etch rate on a duty cycle in the pulsed plasmas.

14. The process of claim 1, wherein the etch chemistry has an inversion of selectivity with respect to a silicon oxide etching and a silicon nitride etching.

* * * * *